United States Patent
Oda et al.

(10) Patent No.: US 11,830,711 B2
(45) Date of Patent: Nov. 28, 2023

(54) COBALT SPUTTERING TARGET

(71) Applicant: JX Nippon Mining & Metals Corporation, Tokyo (JP)

(72) Inventors: Kunihiro Oda, Ibaraki (JP); Takayuki Asano, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 310 days.

(21) Appl. No.: 15/514,634

(22) PCT Filed: Sep. 25, 2015

(86) PCT No.: PCT/JP2015/077150
§ 371 (c)(1),
(2) Date: Mar. 27, 2017

(87) PCT Pub. No.: WO2016/052348
PCT Pub. Date: Apr. 7, 2016

(65) Prior Publication Data
US 2017/0236696 A1   Aug. 17, 2017

(30) Foreign Application Priority Data

Sep. 29, 2014 (JP) .................................. 2014-199088

(51) Int. Cl.
*H01J 37/34* (2006.01)
*C22C 19/07* (2006.01)
*C23C 14/34* (2006.01)

(52) U.S. Cl.
CPC .......... *H01J 37/3426* (2013.01); *C22C 19/07* (2013.01); *C23C 14/3414* (2013.01)

(58) Field of Classification Search
CPC ... C23C 14/06; C23C 14/3414; H01J 37/3426
USPC ..................... 204/298.13, 298.12; 148/120
See application file for complete search history.

(56) References Cited

U.S. PATENT DOCUMENTS

| 6,123,783 A * | 9/2000 | Bartholomeusz ..... H01F 41/183 148/312 |
| 6,176,944 B1 * | 1/2001 | Snowman ................ C22F 1/10 148/120 |
| 6,391,172 B2 | 5/2002 | Cole et al. |
| 6,652,668 B1 | 11/2003 | Perry et al. |
| 6,818,119 B2 | 11/2004 | Wang et al. |
| 2001/0001438 A1 * | 5/2001 | Cole ...................... C22C 19/07 204/298.13 |

FOREIGN PATENT DOCUMENTS

| EP | 0799905 A1 | 10/1997 |
| JP | 2003-073817 A | 3/2003 |
| JP | 2003-306751 A | 10/2003 |
| JP | 2007-297679 A | 11/2007 |

* cited by examiner

*Primary Examiner* — Rodney G McDonald
(74) *Attorney, Agent, or Firm* — HOWSON & HOWSON LLP

(57) ABSTRACT

A Co sputtering target having a purity of 99.99% to 99.999% and a Si content of 1 wtppm or less. Provided is a Co sputtering target capable of improving barrier properties and adhesiveness by suppressing conversion into highly reactive silicide by a reduction in the Si content in cobalt.

3 Claims, No Drawings

COBALT SPUTTERING TARGET

BACKGROUND

The present invention relates to a cobalt sputtering target which is useful in forming cap layers and barrier layers in the Cu wiring structure of advanced semiconductor devices.

BACKGROUND ART

Conventionally, in a Cu wiring structure of a semiconductor device, a Ta/TaN barrier layer was formed on the lateral face of the Cu wiring or a Si-based cap layer was formed on the upper part of the Cu wiring in order to prevent the dispersion of Cu in the insulating film. Nevertheless, pursuant to the miniaturization of semiconductor devices, demands for film characteristics are becoming much stricter, and there is a problem in that the desired characteristics cannot be sufficiently satisfied with conventional materials. In particular, barrier layers and cap layers need to be uniform and possess sufficient barrier properties and adhesiveness.

Switching from the conventional Ta/TaN barrier layer to a TaN/CVD-Co barrier layer is a promising solution to the foregoing problem, but CVD (chemical vapor deposition method) cannot sufficiently overcome the problems of precursor gas residue and base film oxidation, and therefore it was difficult to adopt the CVD-Co technology. Accordingly, deposition based on PVD (physical vapor deposition method), which enables stable deposition as well as ultrathin and uniform deposition by utilizing techniques such as reactive sputtering and reverse sputtering, is desired, and aggressive development is being pursued.

A high purity cobalt target has conventionally been used for forming a salicide film for use in a gate electrode (refer to Patent Documents 1 and 2), but a barrier layer is deposited, for example, between a Cu wiring and a Ta film, and therefore the characteristics required for the use as a barrier layer differ considerably from those for use in a gate electrode. In particular, $CoSi_2$ has been required as a product of a reaction with Poly-Si for use in a gate electrode, but in those for use as a barrier layer, there were cases where Si would become dispersed in Ta, in which Si is predisposed to form into more stable silicide, and thereby deteriorate the barrier properties. Furthermore, when Si becomes dispersed on the Cu wiring side, brittleness is increased due to generation of copper silicide, and problems such as deterioration in adhesiveness will arise.

Meanwhile, a thick film Co disposed as a cap layer on the upper part of the Cu wiring has been conventionally formed via CVD, but because CVD entails the problems described above, deposition based on PVD has been desired. Since this cap layer is a thick film in comparison to films for gate use or barrier use, there was a problem in that the sputtering performance would deteriorate due to magnetic properties despite the fact that the a large amount of target is used, it is difficult to prepare a target having a thickness of 3 mm or more, and an increase in costs as a result of having to stop the device pursuant to the increase in the frequency of replacing the target was also a problem.

Note that Patent Documents 3 to 6 disclose increasing the sputtering efficiency by improving the leakage flux on the surface of the sputtering target made from cobalt, which is a ferromagnetic material. Nevertheless, none of the foregoing Patent Documents teach attaining both the target thickness and high leakage flux, and, while they offer descriptions on reducing general impurities (transition metals, alkali metals and the like) in semiconductor devices, they do not recognize Si as an impurity, nor do they attempt to specifically reduce Si.

CITATION LIST

Patent Documents

Patent Document 1: JP H09-272970 A
Patent Document 2: JP 2007-297679 A
Patent Document 3: JP 2001-200356 A
Patent Document 4: JP 2003-306751 A
Patent Document 5: JP 2001-514325 A
Patent Document 6: JP 2005-528525 A

SUMMARY

Technical Problem

An object of the present invention is to provide a cobalt sputtering target, which is useful for forming liners and cap layers required to be a thick film since barrier properties and adhesiveness can be improved by suppressing conversion into highly reactive silicide by a reduction in the Si content in cobalt, high PTF can be obtained by appropriately controlling the target structure even when the target thickness is increased, and high speed deposition with stabilized plasma can thereby become possible.

Solution to Problem

In light of the foregoing problems, the present invention provides the following:

1) A Co sputtering target having a purity of 99.99% to 99.999% and a Si content of 1 wtppm or less.
2) The Co sputtering target according to 1) above, wherein a thickness of the target is 4 mm to 15 mm, and when a thickness of the target is T(mm) and a PTF value (%) of the target is P, the thickness and the PTF value of the target satisfy a relational expression of $(P-80)/T \geq -2.5$.

Advantageous Effects of Invention

The present invention can improve barrier properties and adhesiveness by suppressing conversion into highly reactive silicide by a reduction in the Si content in cobalt, as well as effectively orient the axis of easy magnetization on a sputtering surface by modifying the structure of the target, and thereby, the present invention yields a superior effect of enabling stable high speed deposition.

DETAILED DESCRIPTION

The Co sputtering target of the present invention is characterized by having a purity of 99.99% (4N) or higher and 99.999% (5N) or less (weight ratio), and a Si content of 1 wtppm or less. The Si content is preferably 0.5 wtppm or less, and more preferably 0.1 wtppm or less. By reducing the Si content in the Co target, it is possible to suppress conversion into highly reactive silicide in the deposited barrier layer or cap layer, as well as improve barrier properties, adhesiveness and wiring resistance. Meanwhile, higher purity of the target is preferable for preventing deterioration of the device performance caused by impurities, but when the purity exceeds 5N, this is undesirable since refining costs will increase. Accordingly, in a Co target having a purity of 4N to 5N, the present invention took particular note of Si as an impurity, and is characterized by a reduction in the Si content.

Moreover, the Co sputtering target of the present invention is characterized in that: a thickness of the target is 4 mm to 15 mm; and when a thickness of the target is T (mm) and a PTF value (%) of the target is P, the thickness and the PTF value of the target satisfy a relational expression of $(P-80)/T \geq -2.5$. A Co target has a problem in that the sputtering performance becomes deteriorated due to magnetic properties, and conventionally it was difficult to prepare a Co target having a thickness of 3 mm or more. However, by controlling the orientation of the target, it is possible to increase the pass through flux (PTF) even with this kind of thick target, and thereby improve its deposition rate via sputtering.

Generally speaking, the thickness of a target and the PTF value have a linear relationship. For instance, when the orientation of the target is not controlled, the relational expression thereof will be roughly $(P-80)/T=-10.0$. Nevertheless, when such a target that satisfies this kind of relational expression has a thickness of 3 mm or less, high speed deposition is possible, but when the thickness is increased, sufficient pass through flux cannot be obtained, and the sputtering efficiency will deteriorate drastically. Accordingly, the Co target of the present invention possessing the foregoing characteristics is particularly effective from the perspective of sputtering efficiency when forming a cap layer or other thick films.

The PTF (Pass-Through-Flux) is measured based on ASTM F2086-01. Foremost, a base for mounting the measuring object (target) and a tool for fixing a permanent magnet to be disposed under the base are prepared from plastic or nonmagnetic metal (for instance, aluminum or the like), and a support, which is capable of holding a Hall probe for measuring the flux density above the target and moving the Hall probe in the in-plane direction of the target, is also prepared from a material such as plastic that will not affect the flux. As the permanent magnet, a horseshoe magnet (Cast AlNiCo 5 Magnet, width 100 mm, height 85 mm) is prepared, and mounted on the fixing tool.

Subsequently, the magnet and the Hall probe are fixedly mounted on the measuring tool, and a gaussmeter is connected to the Hall probe. A plastic reference plate having the same thickness as the measuring object (target) is mounted on a table, and the support on which the Hall probe was mounted is moved above the surface of the dummy target to search for the position at which the flux density of the permanent magnet becomes maximum, and the magnetic field that is measured at this position is used as the Reference field.

The target to be measured is mounted on the table in substitute for the reference plate, and the Hall probe that was fixed to the support and adjusted to the foregoing height is placed at the measurement position. Subsequently, the permanent magnet is moved below the position to be measured, the Hall probe correspondingly moves with the permanent magnet, and the process of recording the maximum flux density is repeated. Measurement is performed at a total of 9 measurement points; that is, an intersection of 2 diameter lines perpendicular to one another, intersections of the diameter lines with a concentric circle of which diameter is half the diameter of the target, and intersections of the diameter lines with a concentric circle that is 15 mm inward from the outer circumference of the target. Subsequently, the value obtained by dividing the measured values by the value of the foregoing Reference field and multiplying the product by 100 is used as the pass through flux density (%), and the average of the 9 points is used as the PTF (pass through flux density) (%) of the target.

The Co sputtering target of the present invention can be prepared as follows.

Cobalt having a purity of 99.99% or higher is melted and cast to prepare an ingot, the ingot is thereafter heated in a furnace, in which the temperature is within a range of 1000° C. or higher and 1200° C. or lower (preferably 1100° C. or higher and 1200° C. or lower) and in which the temperature distribution is retained to be constant within ±10° C., and then subject to hot forging. Subsequently, the ingot is thereafter heated in a furnace, in which the temperature is within a range of 1000° C. or higher and 1200° C. or lower (preferably 1100° C. or higher and 1200° C. or lower) and in which the temperature distribution is retained to be constant within ±10° C., and then subject to hot rolling at a rolling reduction of 50% or higher. Furthermore, the ingot is thereafter heated in a furnace, in which the temperature is within a range of 250° C. or higher and 450° C. or lower (preferably 350° C. or higher and 450° C. or lower) and in which the temperature distribution is retained to be constant within ±10° C., and then subject to warm rolling at a rolling reduction of 30% or higher. Subsequently, the ingot is heated and held for 10 hours or more and 20 hours or less in a furnace, in which the temperature is within a range of 200° C. or higher and 400° C. or lower and in which the temperature distribution is retained to be constant within ±10° C. The resulting product is thereafter subject to machining such as grinding and polishing, and processed into a sputtering target shape. It is thereby possible to obtain a Co sputtering target possessing the intended orientation.

EXAMPLES

The present invention is now explained with reference to specific Examples (experimental examples). Comparative Examples are also illustrated. These Examples are included in the scope of the present invention, and these are examples of experiments implemented under specific conditions to facilitate the understanding of the present invention. Accordingly, it goes without saying that the present invention is not limited to the following Examples, and may be variously modified based on the technical concept of the present invention. The present invention covers all of the above.

Example 1

A cobalt ingot having a purity of 99.998% (Si content: 0.9 wtppm) obtained via electron beam melting was subject to hot forging at 1000° C., and thereafter subject to hot rolling at a temperature of 1000° C. and a rolling reduction of 65%. Subsequently, the cobalt ingot was subject to warm rolling at a temperature of 250° C. and a rolling reduction of 45%, and thereafter heated at a holding temperature of 250° C. and a holding time of 10 hours. The thus obtained cobalt plate material having a thickness of 4 mm was machined to prepare a cobalt sputtering target.

With regard to the thus prepared circular cobalt sputtering target, the pass through flux (PTF) in a direction that is parallel to the rolled surface (that is, the surface to become the sputtering surface) was measured at 9 in-plane points (1 center point, 4 intersections of 2 diameter lines perpendicular to one another with a concentric circle of which diameter is half the diameter of the target, and 4 intersections of the diameter lines with a concentric circle that is 15 mm inward from the outer circumference of the target), and the average value thereof was obtained. Consequently, as shown in Table 1, the average PTF value was 75% and the relational expression was (P−80)/T=−1.25. Even with this thick target, the pass through flux was large, and therefore high speed deposition via sputtering was possible.

TABLE 1

| | Hot forging Temperature (° C.) | Hot rolling | | Warm rolling | | Heating and holding | | Thickness mm | PTF % | (PTF-80)/ Thickness |
|---|---|---|---|---|---|---|---|---|---|---|
| | | Temperature (° C.) | Rolling reduction (%) | Temperature (° C.) | Rolling reduction (%) | Temperature (° C.) | Holding time (hr) | | | |
| Example 1 | 1000 | 1000 | 65 | 250 | 45 | 200 | 10 | 4 | 75 | −1.25 |
| Example 2 | 1100 | 1100 | 60 | 350 | 40 | 300 | 15 | 9 | 63.6 | −1.82 |
| Example 3 | 1200 | 1200 | 50 | 450 | 30 | 400 | 20 | 12.7 | 50 | −1.97 |
| Comparative Example 1 | 1250 | 1100 | 80 | — | — | 500 | 2 | 4 | 35 | −11.25 |
| Comparative Example 2 | 1100 | 1000 | 60 | 500 | 40 | 400 | 15 | 4 | 69.5 | −2.63 |
| Comparative Example 3 | 1250 | 1250 | 60 | 500 | 40 | 300 | 15 | 9 | 50 | −3.33 |

Example 2

A cobalt ingot having a purity of 99.998% (Si content: 0.4 wtppm) obtained via electron beam melting was subject to hot forging at 1100° C., and thereafter subject to hot rolling at a temperature of 1100° C. and a rolling reduction of 60%. Subsequently, the cobalt ingot was subject to warm rolling at a temperature of 350° C. and a rolling reduction of 40%, and thereafter heated at a holding temperature of 300° C. and a holding time of 15 hours. The thus obtained cobalt plate material having a thickness of 9 mm was machined to prepare a cobalt sputtering target.

With regard to the thus prepared circular cobalt sputtering target, the pass through flux (PIE) in a direction that is parallel to the rolled surface (that is, the surface to become the sputtering surface) was measured at 9 in-plane points in the same manner as Example 1, and the average value thereof was obtained. Consequently, as shown in Table 1, the average PTF value was 63.6% and the relational expression was (P−80)/T=−1.82. Even with this thick target, the pass through flux was large, and therefore high speed deposition via sputtering was possible.

Example 3

A cobalt ingot having a purity of 99.998% (Si content: 0.08 wtppm) obtained via electron beam melting was subject to hot forging at 1200° C., and thereafter subject to hot rolling at a temperature of 1200° C. and a rolling reduction of 50%. Subsequently, the cobalt ingot was subject to warm rolling at a temperature of 450° C. and a rolling reduction of 30%, and thereafter heated at a holding temperature of 400° C. and a holding time of 20 hours. The thus obtained cobalt plate material having a thickness of 12.7 mm was machined to prepare a cobalt sputtering target.

With regard to the thus prepared circular cobalt sputtering target, the pass through flux (PTF) in a direction that is parallel to the rolled surface (that is, the surface to become the sputtering surface) was measured at 9 in-plane points in the same manner as Example 1, and the average value thereof was obtained. Consequently, as shown in Table 1, the average PTF value was 50% and the relational expression was (P−80)/T=2.36. Even with this thick target, the pass through flux was large, and therefore high speed deposition via sputtering was possible.

Comparative Example 1

A cobalt ingot having a purity of 99.998% (Si content: 0.1 wtppm) obtained via electron beam melting was subject to hot forging at 1250° C., and thereafter subject to hot rolling at a temperature of 1100° C. and a rolling reduction of 80%. Subsequently, the cobalt ingot was subject to heat treatment at 500° C. for 2 hours. The thus obtained cobalt plate material having a thickness of 4 mm was machined to prepare a cobalt sputtering target.

With regard to the thus prepared circular cobalt sputtering target, the pass through flux (PTF) in a direction that is parallel to the rolled surface (that is, the surface to become the sputtering surface) was measured at 9 in-plane points in the same manner as Example 1, and the average value thereof was obtained. Consequently, as shown in Table 1, the average PTF value was 35% and the relational expression was (P−80)/T=−11.25. The pass through flux was insufficient, and therefore high speed deposition via sputtering was difficult.

Comparative Example 2

A cobalt ingot having a purity of 99.998% (Si content: 3.2 wtppm) obtained via electron beam melting was subject to hot forging at 1100° C., and thereafter subject to hot rolling at a temperature of 1000° C. and a rolling reduction of 60%. Subsequently, the cobalt ingot was subject to warm rolling at a temperature of 500° C. and a rolling reduction of 40%, and thereafter heated at a holding temperature of 400° C. and a holding time of 15 hours. The thus obtained cobalt plate material having a thickness of 4 mm was machined to prepare a cobalt sputtering target.

With regard to the thus prepared circular cobalt sputtering target, the pass through flux (PTF) in a direction that is parallel to the rolled surface (that is, the surface to become the sputtering surface) was measured at 9 in-plane points in the same manner as Example 1, and the average value thereof was obtained. Consequently, as shown in Table 1, the average PTF value was 69.5% and the relational expression was (P−80)/T=−2.63. The pass through flux was insufficient, and therefore high speed deposition via sputtering was difficult.

Comparative Example 3

A cobalt ingot having a purity of 99.998% (Si content: 1.2 wtppm) obtained via electron beam melting was subject to hot forging at 1250° C., and thereafter subject to hot rolling at a temperature of 1250° C. and a rolling reduction of 60%.

Subsequently, the cobalt ingot was subject to warm rolling at a temperature of 500° C. and a rolling reduction of 40%, and thereafter heated at a holding temperature of 300° C. and a holding time of 15 hours. The thus obtained cobalt plate material having a thickness of 9 mm was machined to prepare a cobalt sputtering target.

With regard to the thus prepared circular cobalt sputtering target, the pass through flux (PTF) in a direction that is parallel to the rolled surface (that is, the surface to become the sputtering surface) was measured at 9 in-plane points in the same manner as Example 1, and the average value thereof was obtained. Consequently, as shown in Table 1, the average PTF value was 50% and the relational expression was (P−80)/T=−3.33. The pass through flux was insufficient, and therefore high speed deposition via sputtering was difficult.

The present invention is useful as a cobalt sputtering target for forming a wiring structure of semiconductor devices, since barrier properties and adhesiveness can be improved by suppressing conversion into highly reactive silicide by a reduction in the Si content in cobalt, and stable high speed deposition is possible by effectively orienting the axis of easy magnetization on a sputtering surface.

The invention claimed is:

1. A Co sputtering target consisting of cobalt having a purity of 99.99% to 99.999% and an impurity Si content of 1 wtppm or less, wherein the target has a thickness of 9 mm to 15 mm, and wherein the thickness T (mm) and PTF value P (%) of the target satisfy a relation expressed as $(P-80)/T \geq -1.82$.

2. The Co sputtering target according to claim 1, wherein the thickness of the target is 9 mm to 12.7 mm.

3. The Co sputtering target according to claim 1, wherein the thickness and the PTF value of the target satisfy the relational expression of $-1.82 \leq (P-80)/T \leq -1.25$.

* * * * *